US012581655B2

(12) United States Patent
Gao et al.

(10) Patent No.: US 12,581,655 B2
(45) Date of Patent: Mar. 17, 2026

(54) METHOD OF FABRICATING A 3D NAND FLASH MEMORY WITH INCREASED DATA RETENTION CAPABILITY

(71) Applicant: UNITED MEMORY TECHNOLOGY (JIANGSU) LIMITED, Wuxi (CN)

(72) Inventors: Wei Gao, Wuxi (CN); Nyu Shen, Wuxi (CN)

(73) Assignee: UNITED MEMORY TECHNOLOGY (JIANGSU) LIMITED, Wuxi (CN)

( * ) Notice: Subject to any disclaimer, the term of this patent is extended or adjusted under 35 U.S.C. 154(b) by 0 days.

(21) Appl. No.: 18/727,085

(22) PCT Filed: Dec. 11, 2023

(86) PCT No.: PCT/CN2023/137799
§ 371 (c)(1),
(2) Date: Feb. 28, 2025

(87) PCT Pub. No.: WO2024/244378
PCT Pub. Date: Dec. 5, 2024

(65) Prior Publication Data
US 2025/0203867 A1 Jun. 19, 2025

(30) Foreign Application Priority Data

Jun. 1, 2023 (CN) .......................... 202310637072.6

(51) Int. Cl.
*H10B 43/27* (2023.01)
(52) U.S. Cl.
CPC .................................... *H10B 43/27* (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 9,960,180 B1 * 5/2018 Zhou .................... H10D 64/037
2015/0194440 A1 7/2015 Young-Jin et al.
(Continued)

FOREIGN PATENT DOCUMENTS

CN 109801918 A 5/2019
CN 111557049 A 8/2020
(Continued)

*Primary Examiner* — William B Partridge
*Assistant Examiner* — Gustavo G Ramallo
(74) *Attorney, Agent, or Firm* — Bayramoglu Law Offices LLC

(57) ABSTRACT

A 3D NAND flash memory device and fabricating method thereof, comprises: First, a semiconductor substrate layer is provided, wherein cell isolation structures, channel structures and source lead-out spaces are formed on the semiconductor substrate layer, with the cell isolation structures including cell isolation layers and memory cell-occupied spaces. First dielectric layers and second dielectric layers are sequentially deposited, the first dielectric layer covering at least an exposed surface of the cell isolation structure. The second dielectric layers are then etched to remove all of the second dielectric layers on the side surface and at least part of the second dielectric layers on the second surface, and all of the second dielectric layers on the first surface is retained, with the remaining second dielectric layer forming at least one electron capture layer for memory cell structures. The memory cell structures and electrode structures for the flash memory device are finally fabricated.

8 Claims, 8 Drawing Sheets

Forming a plurality of cell isolation structures spaced apart in a horizontal direction and channel structures penetrating the cell isolation structures in a vertical direction on the semiconductor substrate layer, wherein the interval spaces on both sides of the cell isolation structures are source lead-out spaces used to form lead-out structures — S1

Depositing first dielectric layers and second dielectric layers in sequence, wherein the second dielectric layers cover the first dielectric layers, and the first dielectric layers at least cover the exposed surface of the cell isolation structures — S2

Etching the second dielectric layers using an etching solution with the remaining photosensitive layers as etching masks to remove all of the second dielectric layers on the side surface and to remove at least a portion of the second dielectric layers on the second surface, and retaining all of the second dielectric layers on the first surface — S3

Fabricating memory cell structures and electrode structures for the flash memory device — S4

(58) Field of Classification Search
CPC ........ H10B 53/50; H10B 41/00; H10B 41/10;
H10B 41/20; H10B 41/23; H10B 41/27;
H10B 41/30; H10B 41/35; H10B
41/40–44; H10B 41/46–50; H10B 41/60;
H10B 41/70; H10B 43/00; H10B 43/10;
H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50
See application file for complete search history.

(56) References Cited

U.S. PATENT DOCUMENTS

| | | | | | |
|---|---|---|---|---|---|
| 2019/0103410 | A1* | 4/2019 | Daycock | ................ | H10B 41/35 |
| 2019/0206884 | A1* | 7/2019 | Ng | ..................... | H01L 23/5226 |

FOREIGN PATENT DOCUMENTS

| | | | |
|---|---|---|---|
| CN | 113924646 A | 1/2022 |
| CN | 116528589 A | 8/2023 |

* cited by examiner

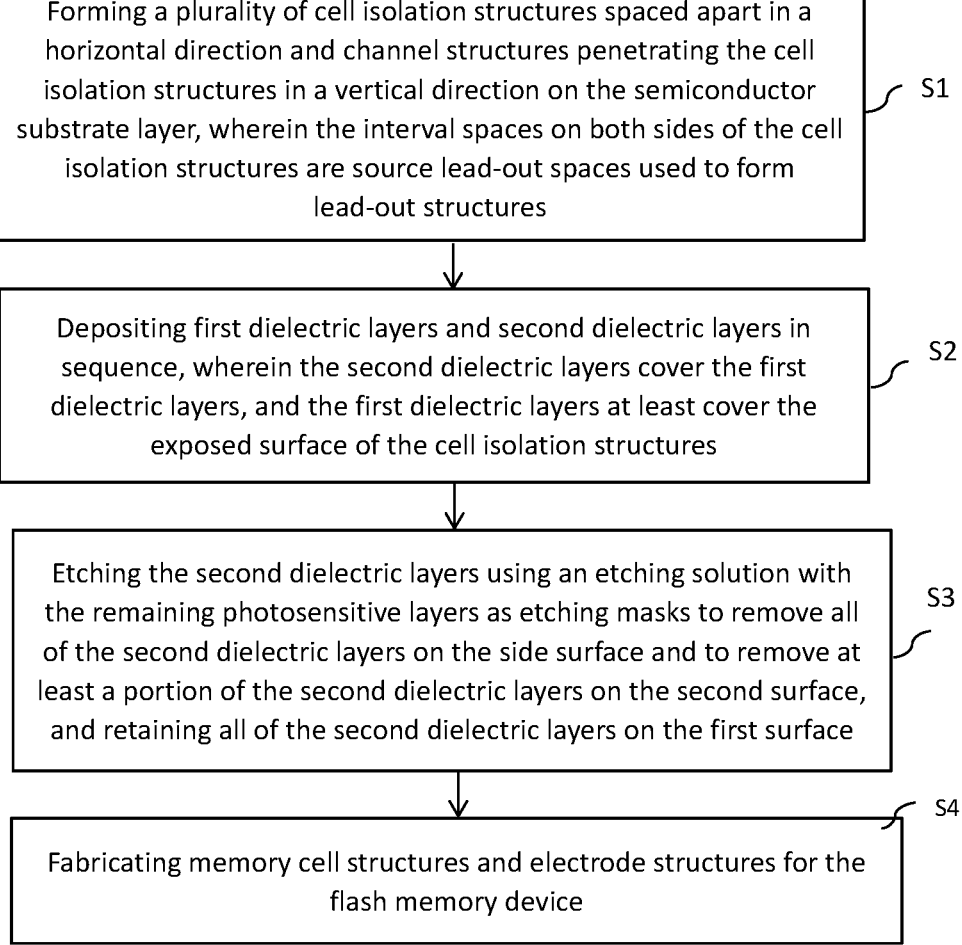

Forming a plurality of cell isolation structures spaced apart in a horizontal direction and channel structures penetrating the cell isolation structures in a vertical direction on the semiconductor substrate layer, wherein the interval spaces on both sides of the cell isolation structures are source lead-out spaces used to form lead-out structures — S1

Depositing first dielectric layers and second dielectric layers in sequence, wherein the second dielectric layers cover the first dielectric layers, and the first dielectric layers at least cover the exposed surface of the cell isolation structures — S2

Etching the second dielectric layers using an etching solution with the remaining photosensitive layers as etching masks to remove all of the second dielectric layers on the side surface and to remove at least a portion of the second dielectric layers on the second surface, and retaining all of the second dielectric layers on the first surface — S3

Fabricating memory cell structures and electrode structures for the flash memory device — S4

Figure 15

METHOD OF FABRICATING A 3D NAND FLASH MEMORY WITH INCREASED DATA RETENTION CAPABILITY

TECHNICAL FIELD

The present disclosure relates to the technical field of semiconductor memory devices, in particular, to a 3D NAND flash memory device and fabricating method thereof.

BACKGROUND TECHNOLOGY

The data in a NAND flash device is stored as a charge, that is, the state and the quantity of stored electric charge represents the data in the NAND flash memory device. Usually, when the quantity state of charge in a memory cell of a NAND flash memory device is in a state of multiple carriers, it indicates that the data stored in the memory cell is "1", and when the charge quantity state is in a state of few carriers, it indicates that the data stored in the memory cell is "0". And the amount of charge stored depends on the voltage applied to the gate.

When programming the memory cell, the charges flow from the substrate into an electron capture layer of a memory cell by utilizing the tunnel effect, so that the quantity state of charge of the electron capture layer is in a state of multiple carriers. However, over a period of time, for example, exposed to external influences such as temperature changes, the charge moves a certain distance in the electron capture layer.

FIG. 1 is a schematic diagram illustrating the charge state in the electron capture layer of the memory cell in the related art when the programming operation has just been completed. As can be seen from FIG. 1, when the programming operation has just been completed, the charge distribution in the electron capture layer 1 is relatively concentrated. FIG. 2 is a schematic diagram illustrating the charge state in the electron capture layer of the memory cell in the related art after the programming operation has been completed for a certain period of time, as can be seen in FIG. 2, the charge in the electron capture layer 1 undergoes diffusion after the programming operation has been completed for a certain period of time.

Since the distribution of the charge in the electron capture layer affects the threshold voltage for the memory cell, when changing from the state of charge concentration in FIG. 1 to the state of charge diffusion shown in FIG. 2, the threshold voltage of the programmed memory cell becomes lower, which results in poorer data retention for that memory cell, i.e., shorter data retention life.

SUMMARY OF THE INVENTION

The present disclosure provides a 3D NAND flash memory device and fabricating method thereof, which can solve the problem in the related art that charge diffuses in the electron capture layer after a period of time after the programming operation is completed, resulting in a decrease in the threshold voltage of the memory cell and a deterioration in the data retention capability.

Aiming to solve the technical problem described in the Background Technology, the first aspect of the present disclosure provides a method for fabricating a 3D NAND flash memory device, wherein the method for fabricating a 3D NAND flash memory device comprising the following sequential steps:

providing a semiconductor substrate layer, forming a plurality of cell isolation structures spaced apart in a horizontal direction and channel structures penetrating the cell isolation structures in a vertical direction on the semiconductor substrate layer, wherein the interval spaces on both sides of the cell isolation structures are source lead-out spaces; each of the cell isolation structures comprises a plurality of cell isolation layers spaced apart in a vertical direction, the interval spaces inside the cell isolation structure are memory cell-occupied spaces, and the sidewall of the channel structure is exposed at the position of the memory cell-occupied spaces;

depositing first dielectric layers and second dielectric layers in sequence, wherein the second dielectric layers cover the first dielectric layers, and the first dielectric layers at least cover the exposed surface of the cell isolation structures; the exposed surfaces of the cell isolation structures comprises: the surface of each of the memory cell-occupied spaces and the side of each layer of the cell isolation layers close to the source lead-out spaces; the surface of the memory cell-occupied spaces comprises: at least one first surface of the channel structure exposed from the memory cell-occupied spaces, and at least one second surface of the cell isolation layers positioned in the memory cell-occupied spaces;

etching the second dielectric layers to remove all of the second dielectric layers on the side surface and at least part of the second dielectric layers on the second surface, and retaining all of the second dielectric layers on the first surface, with the remaining second dielectric layer forming at least one electron capture layer for memory cell structures;

fabricating the memory cell structures and electrode structures for the flash memory device.

Optionally, the step of etching the second dielectric layer, removing all of the second dielectric layer on the side, removing at least part of the second dielectric layer on the second surface, and retaining all of the second dielectric layer on the first surface comprises:

coating photosensitive layers, wherein the photosensitive layers fill the memory cell-occupied spaces and the source lead-out spaces;

removing the photosensitive layers positioned in the source lead-out spaces, and retaining the photosensitive layers positioned in the memory cell-occupied spaces;

etching the second dielectric layers using an etching solution with the remaining photosensitive layers as etching masks to remove all of the second dielectric layers on the side surface and to remove at least a portion of the second dielectric layers on the second surface, and retaining all of the second dielectric layers on the first surface;

removing the remaining photosensitive layers.

Optionally, the step of etching the second dielectric layers using an etching solution with the remaining photosensitive layer as an etching mask, and retaining the second dielectric layers positioned on the surface of the channel structure exposed from the memory cell-occupied spaces to form at least one electron capture layer structure comprises:

etching the second dielectric layers using an etching solution with the remaining photosensitive layers as etching masks to remove all of the second dielectric layers on the side surface and to remove all of the second dielectric layers on the second surface, and retaining all of the second dielectric layers on the first surface;

forming at least one electron capture layer for the memory cell structure from the remaining second dielectric layers.

Optionally, the step of etching the second dielectric layers using an etching solution with the remaining photosensitive layer as an etching mask, and retaining the second dielectric layers positioned on the surface of the channel structure exposed from the memory cell-occupied spaces to form at least one electron capture layer structure comprises:

etching the second dielectric layers using an etching solution with the remaining photosensitive layers as etching masks to remove all of the second dielectric layers on the side surface and to remove at least a portion of the second dielectric layers on the second surface, and retaining all of the second dielectric layers on the first surface;

forming the electron capture layer for the memory cell structure from the remaining second dielectric layers, forming an extension portion of the electron capture layer from the remaining second dielectric layers on the second surface, and forming a main body of the electron capture layer from the remaining second dielectric layers on the first surface.

Optionally, the channel structure comprises channel holes, and channel polysilicon layers and channel dielectric layers that fill the channel holes; the channel holes extend into the semiconductor substrate layer, with the channel polysilicon layers covering the inner wall of the channel holes and surrounding the outer periphery of the channel dielectric layers;

the extension portion extends from both ends of the main body along the second surface by a first length.

Optionally, the step of removing the photosensitive layers positioned in the source lead-out spaces, and retaining the photosensitive layers positioned in the memory cell-occupied spaces comprises:

irradiating the photosensitive layers filled in the source lead-out spaces through a mask by utilizing ultraviolet rays;

removing the photosensitive layers filled in the source lead-out spaces by means of a developing solution, and retaining the photosensitive layers positioned in the memory cell-occupied space.

Optionally, in the step of fabricating the memory cell structure and the electrode structure for the flash memory device, the step of fabricating the memory cell structure for the flash memory device comprises:

etching the first dielectric layers to remove the first dielectric layers covering the side surface, retaining the first dielectric layers covering the surface of the memory cell-occupied spaces, with the remaining first dielectric layers forming at least one electron tunneling layer for the memory cell structure;

fabricating at least one oxide isolation layer and at least one high dielectric film layer for the memory cell structure;

the oxidation isolation layer is positioned in the memory cell-occupied spaces, covering the exposed surface of the electron tunneling layer and the exposed surface of the electron capture layer;

the high dielectric film layer is positioned in the memory cell-occupied spaces, covering the exposed surface of the oxide isolation layer;

the high dielectric thin film layer surrounds and forms at least one gate-occupied space which is used to form at least one gate electrode.

Optionally, in the step of providing a semiconductor substrate layer, forming a plurality of cell isolation structures spaced apart in a horizontal direction and channel structures penetrating the cell isolation structures in a vertical direction on the semiconductor substrate layer, wherein the interval spaces on both sides of the cell isolation structures are source lead-out spaces, the bottom layer of each of the cell isolation structures is the memory cell-occupied space, and the top layer of each of the cell isolation structures is the cell isolation structure.

Optionally, the step of providing a semiconductor substrate layer, forming a plurality of cell isolation structures spaced apart in a horizontal direction and channel structures penetrating the cell isolation structures in a vertical direction on the semiconductor substrate layer, wherein the interval spaces on both sides of the cell isolation structures are source lead-out spaces comprises:

providing a semiconductor substrate layer, forming a composite layer structure on the semiconductor substrate layer, wherein the composite layer structure comprises multiple sacrificial dielectric layers and multiple cell isolation dielectric layers alternately stacked in sequence;

forming channel structures in the composite layer structure, wherein the channel structures penetrate the composite layer structure in a vertical direction and extend into the semiconductor substrate layer;

source lead-out spaces are formed in the composite layer structure, wherein the ends of the sacrificial dielectric layers and the upper surface of the semiconductor substrate layer are exposed in the source lead-out spaces;

removing the sacrificial dielectric layers by etching to form the memory cell-occupied space, and forming cell isolation layers from the remaining cell isolation dielectric layers.

In order to solve the technical problems described in the Background Technology, another aspect of the present disclosure provides a 3D NAND flash memory device, wherein the 3D NAND flash memory device is fabricated by the 3D NAND flash memory device described in the first aspect of the present disclosure.

The technical solution provided by the present disclosure, at least, possesses the following advantages: the present disclosure facilitates the data retention capability by placing the electron capture layer structure used for storing electrons in the respective memory cell structure at a location close to the channel structure, thereby making it possible to avoid the problem of charge diffusion in the electron capture layer after a period of programming operation, avoiding the decrease of a threshold voltage for the memory cell.

BRIEF DESCRIPTION OF THE DRAWINGS

In order to illustrate the technical solutions in the specific embodiments or prior art of the present application, the drawings, which are required to be shown in the description of the Specific Embodiments or prior art, will be briefly described below. It will be apparent to those skilled in the art that the drawings in the following detailed description are merely some of the embodiments of the present disclosure and that other drawings may be obtained from these drawings without any creative labor.

FIG. 15 illustrates a flowchart of a method for fabricating the 3D NAND flash memory device according to an embodiment of the present disclosure.

SPECIFIC EMBODIMENTS

Figure 1:
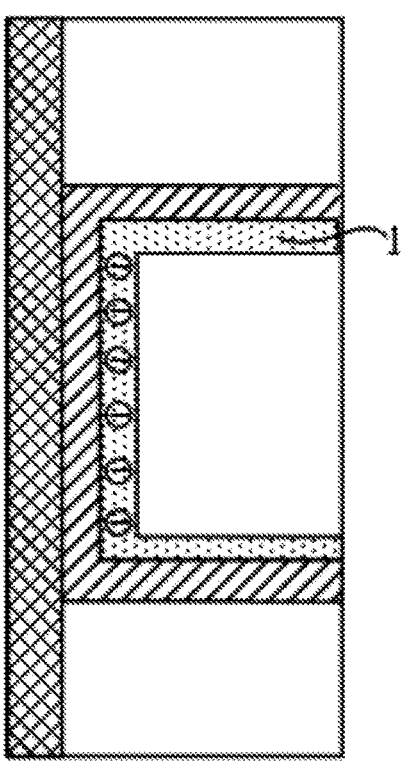
FIG. 1 illustrates a schematic diagram of the state of charge in an electron capture layer of a memory cell in the related art when the programming operation has just been completed.
Figure 2:
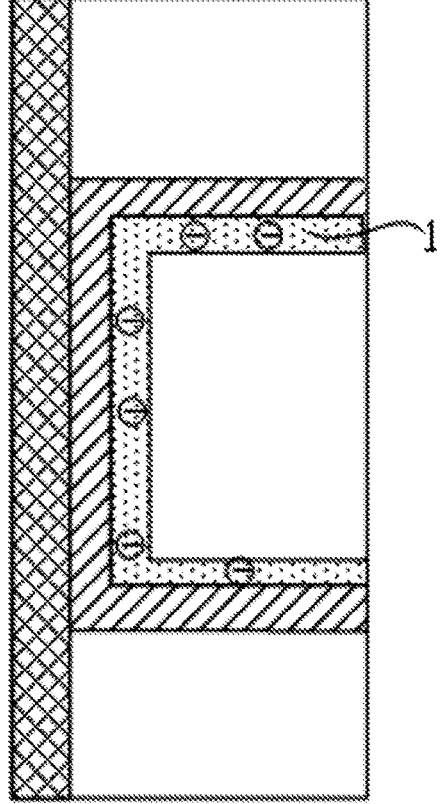
FIG. 2 illustrates a schematic diagram of the state of charge in the electron capture layer of the memory cell in the related art after the programming operation has been completed for a period of time.

The technical solution provided by the present disclosure will be clearly and completely understood from the following detailed deion by reference to the drawings. Obviously, the described embodiments are only part of the embodiments of the present disclosure, rather than all of the embodiments. According to the embodiment of the present disclosure, all other embodiments obtained by those skilled in the art without making creative labor fall within the scope of the present disclosure.

The terms "center", "top," "bottom," "left," "right," "vertical", "horizontal", "inside", "outside" and the like in the description, indicating orientations or positional relationships, are based on the orientations or positional relationships shown in the accompanying drawings, and are used only for the purpose of facilitating and simplifying the description and not necessarily for indicating or implying a specific orientation for the device or element referred to or that the device or element referred to is constructed and operated in a specific orientation, which should not be understood as a limitation on the present disclosure. The terms "first", "second", and "third" in the description, if any, are used for descriptive purposes and not necessarily for indicating or implying relative importance.

In the description of the present disclosure, it should be noted that, unless otherwise clearly specified and limited, the terms "install/installs/installed/installing", "connect/connects/connected/connecting" and "couple/couples/coupled/coupling" should be broadly understood. For example, it can be a fixed connection, a detachable connection, or an integral connection; it can be a mechanical connection or an electrical connection; it can be a direct connection or an indirect connection through an intermediate medium; it can also be the internal connection of two elements, it can be a wireless connection or a wired connection. To those skilled in the art, the specific meaning of the above terms in this disclosure may be understood in specific cases.

Furthermore, the technical involved in the different embodiments of the present disclosure described below may be combined with each other as long as they do not constitute a conflict with each other.

FIG. 15 illustrates a flowchart of a method for fabricating a 3D NAND flash memory device according to an embodiment of the present disclosure, and as can be seen from FIG. 15, the method for fabricating the 3D NAND flash memory device comprises the following steps S1 to S4 performed in sequence.

Step S1: providing a semiconductor substrate layer, forming a plurality of cell isolation structures spaced apart in a horizontal direction and channel structures penetrating the cell isolation structures in a vertical direction on the semiconductor substrate layer, wherein the interval spaces on both sides of the cell isolation structures are source lead-out spaces; each of the cell isolation structures comprises a plurality of cell isolation layers spaced apart in a vertical direction, each of the interval space inside the cell isolation structure is a memory cell-occupied space, and the sidewall of the channel structure is exposed at the position of the memory cell-occupied spaces.

Figure 3:
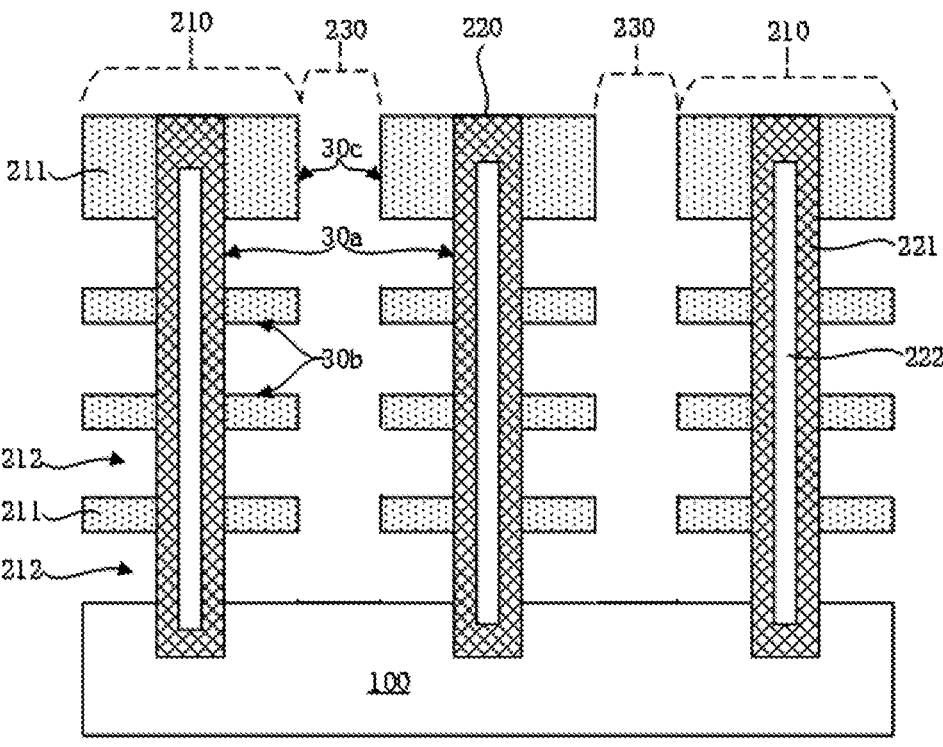
FIG. 3 illustrates a schematic diagram of a cross-sectional structure of a portion of a device after completion of step S1 of the fabricating method for a 3D NAND flash memory device according to an embodiment of the present disclosure.

With reference to FIG. 3, it illustrates a schematic diagram of a cross-sectional structure of a portion of a device after completion of step S1. It can be seen from FIG. 3 that a plurality of cell isolation structures 210 are formed on the semiconductor substrate layer 100 through step S1, and channel structures 220 are formed in each cell isolation structure 210. The channel structures 220 penetrates the corresponding cell isolation structure 210 in the vertical direction, and the bottom ends of all the channel structures 220 extend into the semiconductor substrate layer 100.

In addition, two adjacent cell isolation structures 210 are spaced apart in the horizontal direction to form interval spaces, and the interval spaces disposed on both sides of the respective cell isolation structures 210 are source lead-out spaces 230 for forming source lead-out structures in a subsequent step.

Each cell isolation structure 210 includes multiple cell isolation layers 211 spaced apart in a vertical direction, wherein the interval spaces inside each cell isolation structure 210 are memory cell-occupied spaces 212 for forming a memory cell in the subsequent step. At the location of the memory cell-occupied spaces 212, the sidewalls of the channel structures 220 are exposed.

Exemplarily, the bottom layer of each cell isolation structure 210 is the memory cell-occupied space 212, that is, the space between the semiconductor substrate layer 100 and the adjacent cell isolation layers 211 are the memory cell-occupied spaces 212. In addition, the top layer of each cell isolation structure 210 is the cell isolation structure 211.

Figure 4:
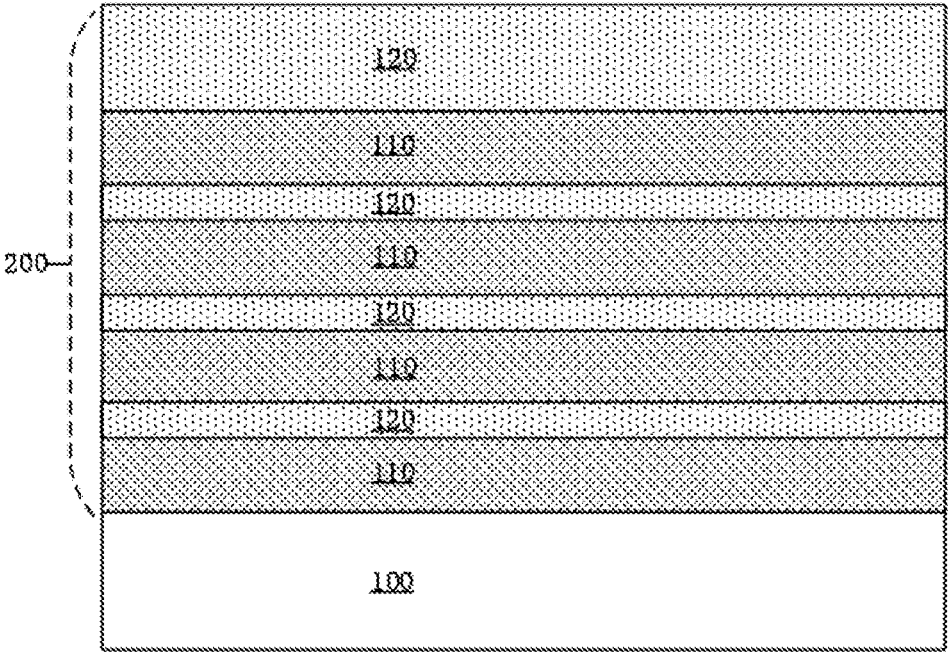
FIG. 4 illustrates a schematic diagram of a cross-sectional structure of a semiconductor substrate layer provided in step S1.
Figure 5:
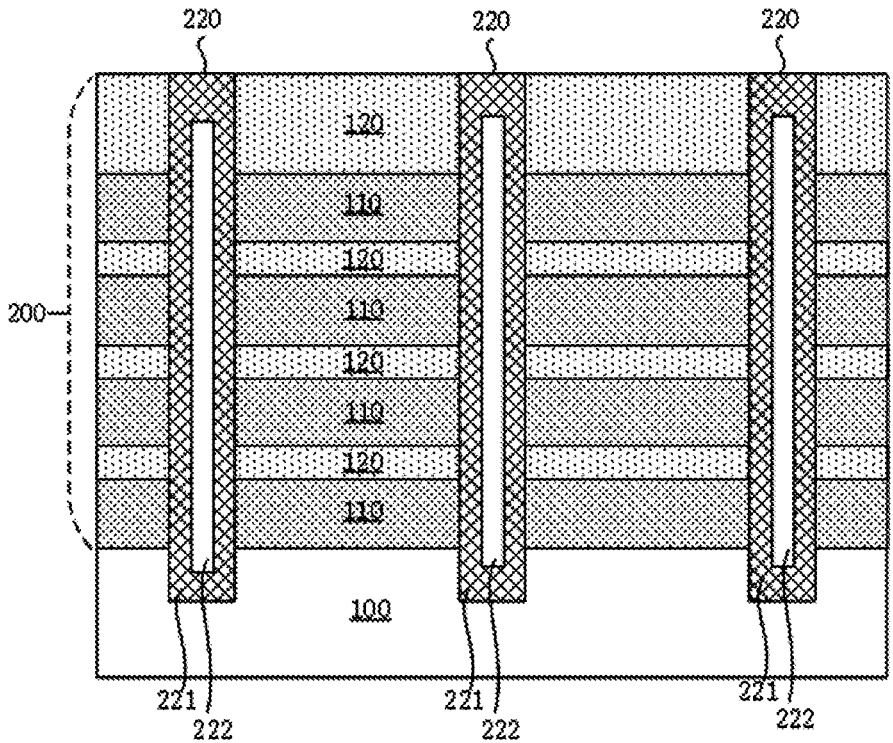
FIG. 5 illustrates a schematic diagram of a cross-sectional structure of the device after the semiconductor substrate layer shown in FIG. 4 forms at least one composite layer structure and channel structure.
Figure 6:
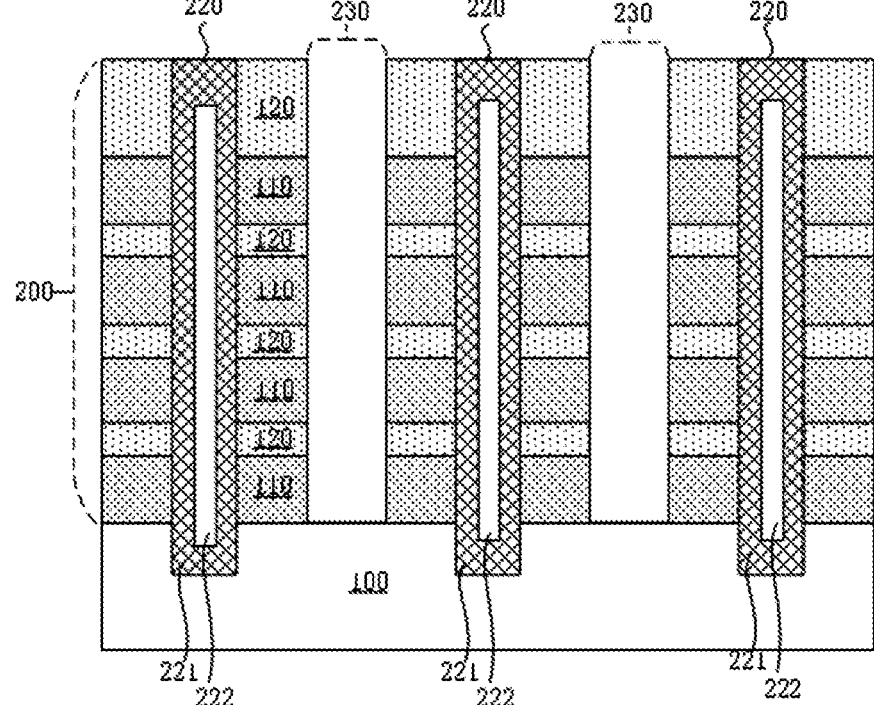
FIG. 6 illustrates a schematic diagram of a cross-sectional structure of the device after the intervals in the composite layer structure shown in FIG. 5 form source lead-out spaces.

The material of the cell isolation layers 211 may be silicon dioxide. The channel structures 220 comprise channel holes, and channel polysilicon layers 221 and channel dielectric layers 222 that fill the channel holes. The channel holes extend into the semiconductor substrate layer 100, with the channel polysilicon layers 221 covering the inner wall of the channel holes and surrounding the outer periphery of the channel dielectric layers 222;

FIGS. 4 to 6 illustrate a schematic diagram of a cross-sectional structure of a device formed after completion of the steps thereof for one embodiment of step S1, and a realizable embodiment for step S1 is described below with reference to FIGS. 4 to 6:

With reference to FIG. 4, a semiconductor substrate layer 100 as shown in FIG. 4 is provided, and a composite layer structure 200 is formed on the semiconductor substrate layer 100. The composite layer structure 200 includes a plurality of sacrificial dielectric layers 110 and a plurality of cell isolation dielectric layers 120 which are alternately stacked in sequence.

Referring to FIG. 5, channel structures 220 are formed in the composite layer structure 200, with the channel structures 220 extending in a vertical direction through the composite layer structure 200 and into the semiconductor substrate layer 100.

The steps of making the channel structures 220 include: firstly, etching to form the channel holes, wherein the channel holes extend into the semiconductor substrate layer 100; then, fabricating channel polysilicon layers 221 and channel dielectric layer 222 in the channel holes, with channel polysilicon layers 221 covering the inner wall of the channel holes and surrounding the outer periphery of the channel dielectric layers 222.

Referring to FIG. 6, source lead-out spaces 230 are formed spaced apart in the composite layer structure 200, with the ends of the sacrificial dielectric layers 110 and an upper surface of the semiconductor substrate layer 100 exposed in the source lead-out spaces 230.

Then, on the basis of the structure shown in FIG. 6, the sacrificial dielectric layers 110 are etched away to form the memory cell-occupied spaces 212 shown in FIG. 3, and the remaining cell isolation dielectric layers 120 form the cell isolation layers 211 shown in FIG. 3.

Step S2: depositing first dielectric layers and second dielectric layers in sequence, wherein the second dielectric layers cover the first dielectric layers, and the first dielectric layers at least cover the exposed surface of the cell isolation structures.

Figure 7:
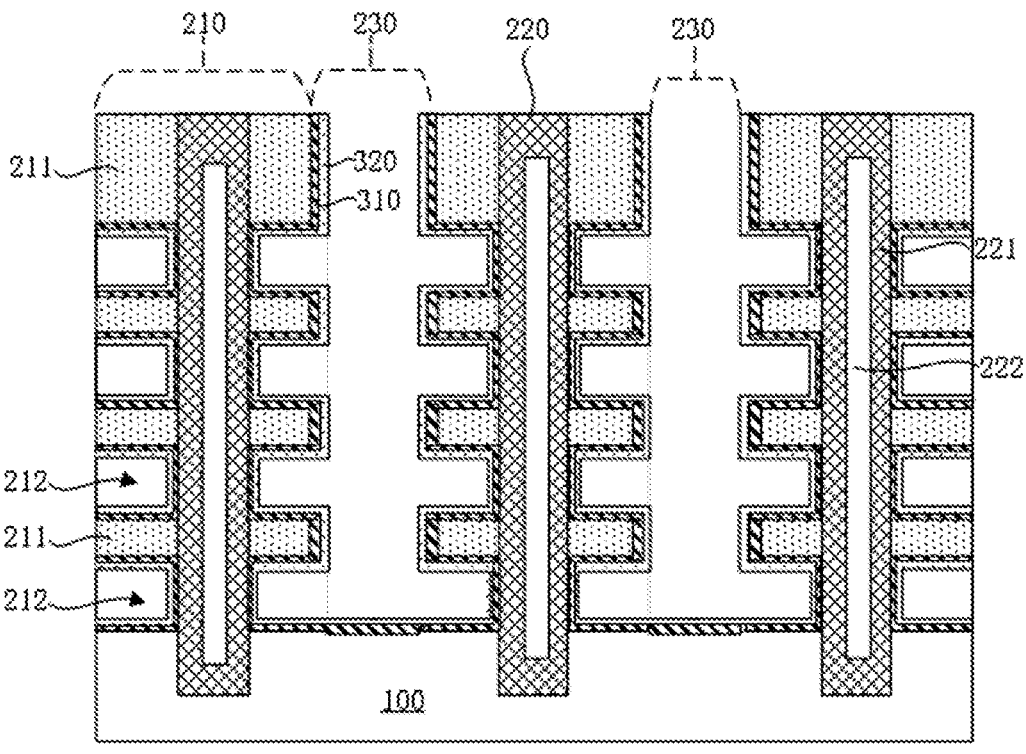
FIG. 7 illustrates a schematic diagram of a cross-sectional structure of a portion of a device after completion of step S2 of the fabricating method for a 3D NAND flash memory device according to an embodiment of the present disclosure.

Referring to FIG. 7, which illustrates a schematic diagram of a cross-sectional structure of the device after completion of step S2, it can be seen from FIG. 7 that the deposited second dielectric layers 320 cover the first dielectric layers 310, which cover the exposed surface of the cell isolation structures 210. The exposed surfaces of the cell isolation structures 210 include the surface of each memory cell-occupied space 212 and the side surface 30c of each cell isolation layer 211 close to the source lead-out spaces 230 as shown in FIG. 3; the surfaces of the memory cell-occupied spaces 212 include a first surface 30a where the channel structures 220 are exposed from the memory cell-occupied spaces 212, and a second surface 30b where the cell isolation layers 211 are located in the memory cell-occupied spaces 212 as shown in FIG. 3. In this embodiment, first dielectric layers 310 and second dielectric layers 320 also cover the upper surface of the semiconductor substrate layer 100.

The first dielectric layers 310 are used in a subsequent step to form at least one electron tunneling layer, the material of which may be silicon dioxide. The second dielectric layers 320 are used in a subsequent step to form at least one electron capture layer, the material of which may be silicon nitride.

Step S3: etching the second dielectric layers to remove all of the second dielectric layers on the side surface and at least part of the second dielectric layers on the second surface, and retaining all of the second dielectric layers on the first surface, with the remaining second dielectric layer forming at least one electron capture layer for memory cell structures.

Figure 8:
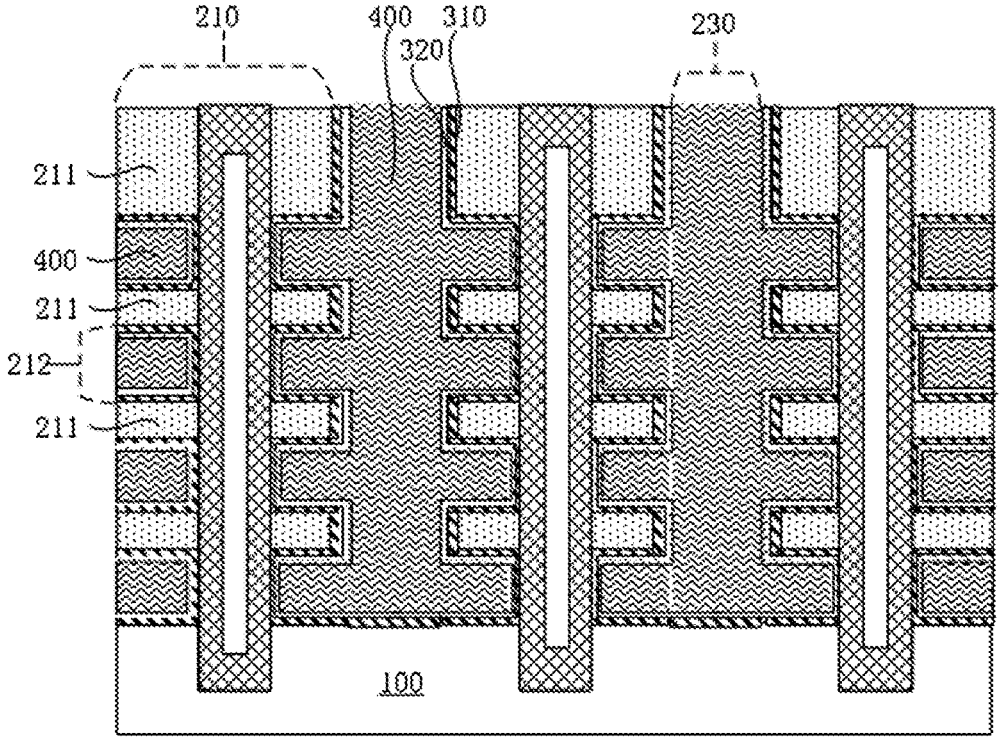
FIG. 8 illustrates a schematic diagram of a cross-sectional structure of the device after photosensitive layers fill up the memory cell-occupied spaces and the source lead-out spaces in the structure shown in FIG. 7.
Figure 9:
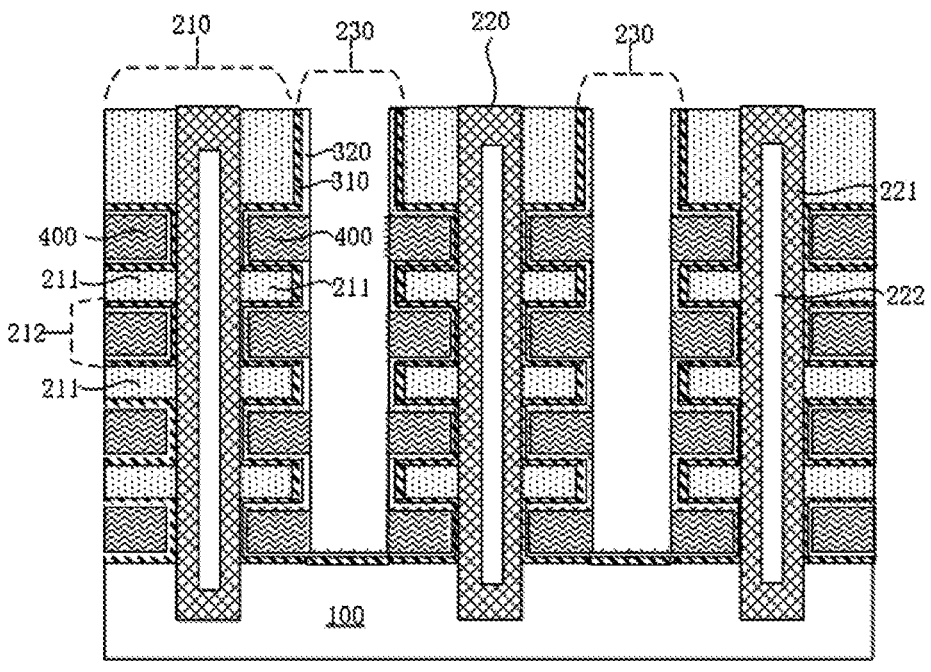
FIG. 9 illustrates a schematic diagram of a cross-sectional structure of the device in which photoreceptor layers positioned in the source lead-out spaces are removed on the basis of FIG. 8, and the remaining photoreceptor layers fill the memory cell-occupied space.
Figure 10:
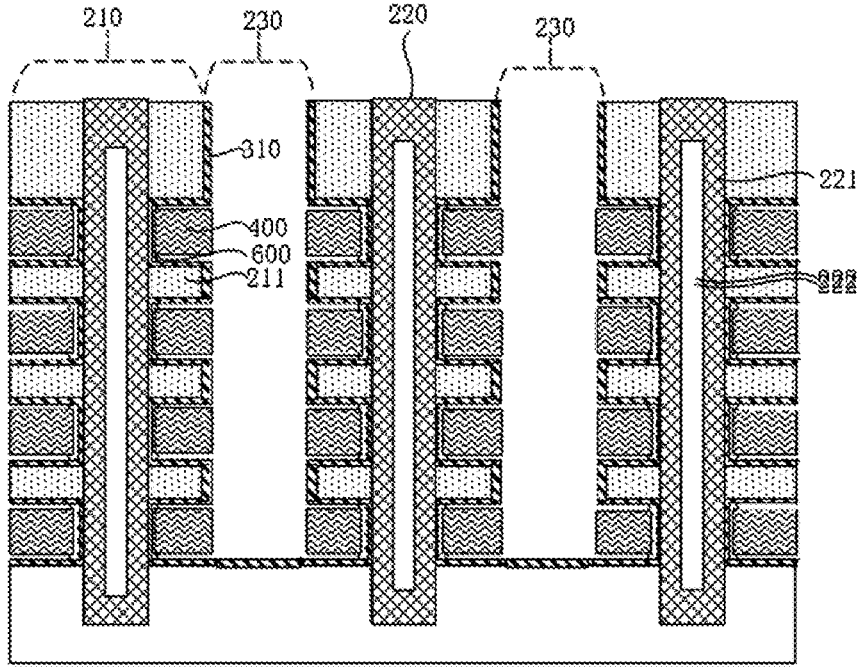
FIG. 10 illustrates a schematic diagram of a cross-sectional structure of the device after second dielectric layers has been partially removed by etching based on the remaining photoreceptor layers in FIG. 9.

FIGS. 8 to 10 illustrate a schematic diagram of a cross-sectional structure of the device formed after completion of the steps thereof for one embodiment of step S3, and one realizable embodiment for step S3 is described below with reference to FIGS. 7 to 10:

Photosensitive layers are first coated, wherein the photosensitive layers fill the memory cell-occupied spaces and the source lead-out spaces; With reference to FIG. 8, the coated photosensitive layers 400 fill the memory cell-occupied spaces 212 and the source lead-out spaces 230 in the structure shown in FIG. 7.

The photosensitive layers positioned in the source lead-out spaces are then removed, with the photosensitive layers in the memory cell-occupied spaces retained.

Referring to FIG. 9, the photosensitive layers 400 disposed in the source lead-out spaces 230 are removed, with the remaining photosensitive layers 400 filling the memory cell-occupied spaces 212. Exemplarily, the photosensitive layer may be an organic polymer capable of reacting chemically under the ultraviolet irradiation. Ultraviolet rays may be irradiated onto the photosensitive layers 400 filled in the source lead-out spaces 230 through a mask, and then a developer may be used to remove the photosensitive layers 400 filled in the source lead-out spaces 230. The photosensitive layers 400 filled in the memory cell-occupied spaces 212 are not irradiated by ultraviolet rays and thus remain insoluble in the developer.

With reference to FIG. 9, after the photosensitive layers 400 in the source lead-out spaces 230 are removed, the second dielectric layers 320 on the side surface 30c (as shown in FIG. 3) are exposed, and the second dielectric layers 320 at the connection position between the second surface 30b (as shown in FIG. 3) and the side surface 30c are exposed.

The second dielectric layers are etched using an etching solution with the remaining photosensitive layers as etching masks to remove all of the second dielectric layers on the side surface and to remove at least a portion of the second dielectric layers on the second surface, with all of the second dielectric layers on the first surface retained.

With reference to FIG. 10, the remaining photosensitive layers 400 fill the memory-cell occupied spaces 212. Due to the etching blocking effect of the photosensitive layers 400, when performing step S5, the second dielectric layers 320 positioned on the first surface 30*a* shown in FIG. 3 are retained without being etched, that is, the second dielectric layers 320 on the first surface 30*a* where the channel structures 220 are exposed from the memory cell-occupied spaces 212 are retained without being etched, with the retained second dielectric layers 320 serving as the electron capture layer structure 600 in the memory cell.

The second dielectric layers 320 disposed on the side surface 30*c* are removed in their entirety by etching due to exposure. Since the second dielectric layers 320 at the connection position between the second surface 30*b* and the side surface 30*c* are also exposed, the etching solution can gradually etch away the entire second dielectric layers 320 or a portion of the second dielectric layers 320 on the second surface 30*b* starting from the connection position.

Finally, the remaining photosensitive layers are removed.

Figure 11:
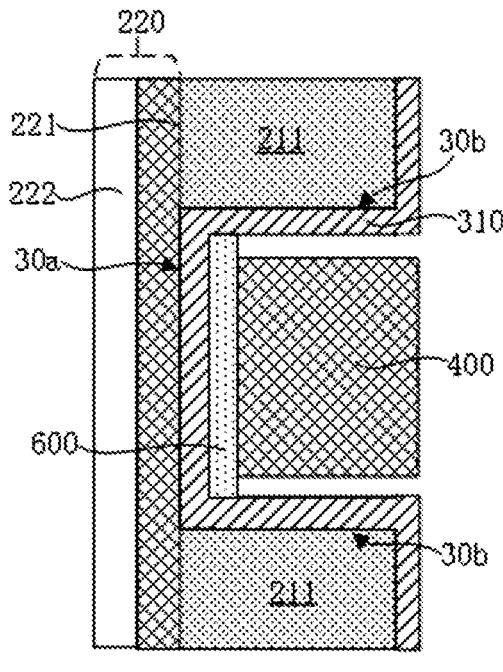
FIG. 11 illustrates a structure formed after the completion of the step of etching the second dielectric layer using an etching solution with the remaining photographic layer as an etching mask.
Figure 12:
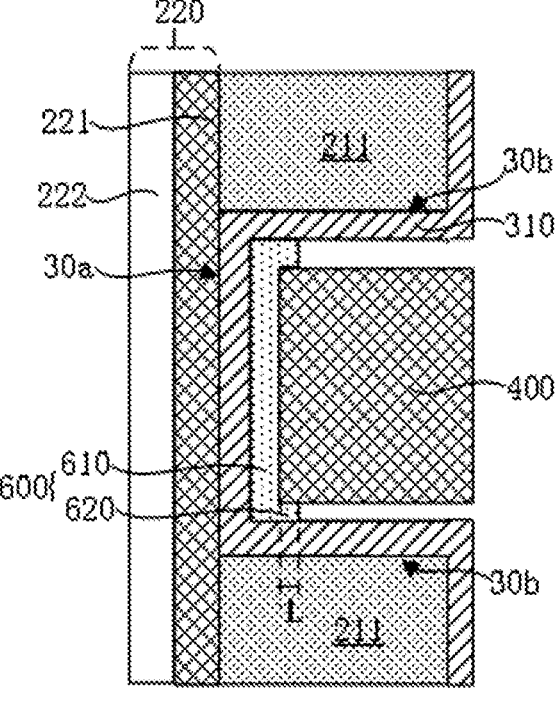
FIG. 12 illustrates another structure formed after the completion of the step of etching the second dielectric layer using an etching solution with the remaining photographic layer as an etching mask.

FIG. 11 illustrates a structure formed after the completion of the step of etching the second dielectric layer using an etching solution with the remaining photographic layer as an etching mask; FIG. 12 illustrates another structure formed after the completion of the step of etching the second dielectric layer using an etching solution with the remaining photographic layer as an etching mask; With reference to FIGS. 11 and 12, the step of etching the second dielectric layers using an etching solution with the remaining photosensitive layer as an etching mask is described below.

With reference to FIG. 11, the second dielectric layers 320 are etched using an etching solution with the remaining photosensitive layers 400 as etching masks to remove all of the second dielectric layers on the side surface 30*c* and to remove all of the second dielectric layers on the second surface 30*b*, with all of the second dielectric layers 320 on the first surface 30*a* retained;

The remaining second dielectric layers 320 form the electron capture layer 600 for the memory cell structure.

With reference to FIG. 12, the second dielectric layers 320 are etched using an etching solution with the remaining photosensitive layers 400 as etching masks to remove all of the second dielectric layers on the side surface 30*c* and to remove at least a portion of the second dielectric layers on the second surface 30*b*, with all of the second dielectric layers 320 on the first surface 30*a* retained.

The remaining second dielectric layers 320 form the electron capture layer 600 for the memory cell structure, the remaining second dielectric layers 320 located on the second surface 30*b* form an extension portion 620 of the electron capture layer 600, and the remaining second dielectric layers 320 located on the first surface 30*a* form a main body 610 of the electron capture layer 600, with the extension portion 620 extending from both ends of the main body 610 along the second surface 30*b* by a first length L, which is less than or equal to half of the length of the memory cell-occupied space.

Exemplarily, the material of the second dielectric layers 320 may be silicon nitride, and the etching solution includes phosphoric acid.

Step S4: fabricating the memory cell structures and electrode structures for the flash memory device.

In the step of fabricating the memory cell structure and the electrode structure for the flash memory device, the step of fabricating the memory cell structure for the flash memory device comprises:

etching the first dielectric layers to remove the first dielectric layers covering the side surface, retaining the first dielectric layers covering the surface of the memory cell-occupied spaces, with the remaining first dielectric layers forming at least one electron tunneling layer for the memory cell structure;

fabricating at least one oxide isolation layer and at least one high dielectric film layer for the memory cell structure;

the oxidation isolation layer is positioned in the memory cell-occupied spaces, covering the exposed surface of the electron tunneling layer and the exposed surface of the electron capture layer; the high dielectric film layer is positioned in the memory cell-occupied spaces, covering the exposed surface of the oxide isolation layer; the high dielectric thin film layer surrounds and forms at least one gate-occupied space which is used to form at least one gate electrode.

Figure 13:
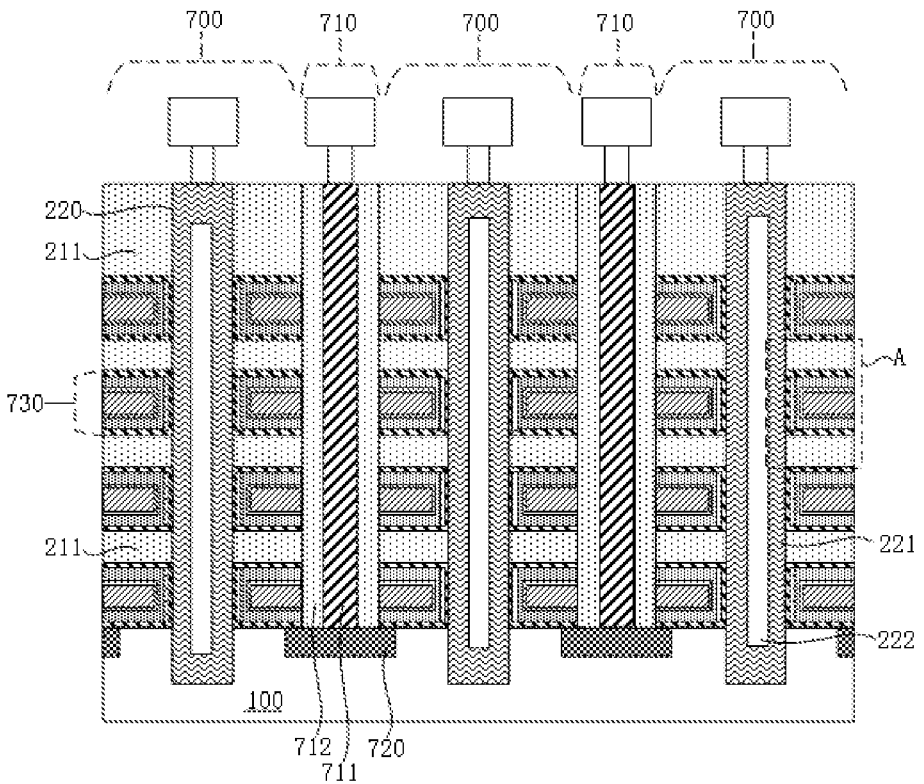
FIG. 13 illustrates a schematic diagram of a cross-sectional structure of the 3D NAND flash memory device according to an embodiment of the present disclosure.

The present disclosure also provides a 3D NAND flash memory device, the 3D NAND flash memory device being fabricated based on the method for fabricating the 3D NAND flash memory device shown in FIG. 15. FIG. 13 illustrates a schematic diagram of a cross-sectional structure of the 3D NAND flash memory device formed after completion of the method for fabricating the 3D NAND flash memory device shown in FIG. 15, and the 3D NAND flash device structure provided by embodiments is described below with reference to FIG. 13.

With reference to FIG. 13, the 3D NAND flash memory device includes a semiconductor substrate layer 100 forming a plurality of stacked structures 700. The stacked structures 700 are a structure formed by the cell isolation structures 210 shown in FIG. 3 after steps S2 to S4 shown in FIG. 15.

Each stack structure 700 has at least one channel structure 220, wherein the channel structure 220 penetrates the stack structures 700 in a vertical direction, and the bottom end of the channel structure 220 extends into the semiconductor substrate layer 100. Exemplarily, the channel structure 220 includes channel holes and channel polysilicon layers 221 and channel dielectric layers 222 that fill the channel holes. The channel holes extend into the semiconductor substrate layer 100, with the channel polysilicon layers 221 covering the inner wall of the channel holes, and the channel polysilicon layers 221 surrounding the outer periphery of channel dielectric layers 222.

Source lead-out structures 710 are formed between two adjacent stacked structures 700. At least one source doping region 720 is formed in the semiconductor substrate layer 100 at the bottom of the source lead-out structures 710, and the source lead-out structures 710 are connected to the source doping region 720 for leading out the source doping region 720.

The source lead-out structure 710 include a source electrode 711 and a source insulating layer 712 located on both sides of the source electrode 711, with the source insulating layer 712 isolating the source electrode 711 from the adjacent stacked structures 700. The top of the source electrode 711 is connected to the bit line of the flash memory device.

Each of the stack structures 700 includes memory cell structures 730 and cell isolation layers 211 alternately stacked in a vertical direction. Exemplarily, the bottom layer of the stacked structure 700 is a memory cell structure 730, and the top layer of the stacked structure 700 is a cell isolation layer 211. The memory cell structure 730 is the structure formed by the memory cell-occupied space 212 shown in FIG. 3 after steps S2 through S4 shown in FIG. 15.

Figure 14:
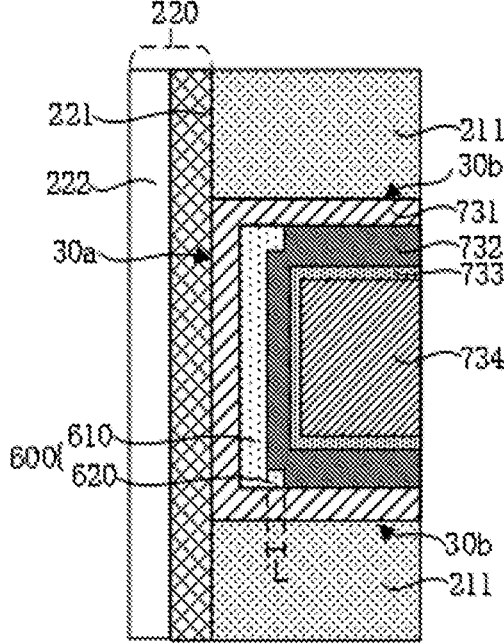
FIG. 14 illustrates an enlarged schematic structure of part A shown in FIG. 13.

FIG. 14 illustrates an enlarged schematic structure of part A shown in FIG. 13, and it can be seen with reference to FIGS. 13 and 14 that the memory cell structure 730 includes an electron tunneling layer 731, an electron capture layer 600, an oxide isolation layer 732, a high dielectric film layer 733, and a gate electrode 734, which are stacked sequentially from the outside to the inside, wherein the electron tunneling layer 731 is a structure formed after the first dielectric layer 310 shown in FIG. 7 undergoes steps S3 to S4, and the electron capture layer 600 is a structure formed after the second dielectric layer 320 shown in FIG. 7 undergoes steps S3 to S4.

The electron tunneling layer 731 covers a portion of the surface of the adjacent channel structures 220, i.e., the first surface 30*a* shown in FIG. 3. The electron tunneling layer 731 also covers the surface of the adjacent cell isolation layers 211, i.e., the second surface 30*b* shown in FIG. 3.

The electron capture layer 600 covers the electron tunneling layer 731 at the first surface 30*a*. Optionally, the electron capture layer 600 includes a main body 610 and an extension portion 620, wherein the main body 610 covers the electron tunneling layer 731 at the first surface 30*a*, and the extension portion 620 extends from both ends of the main body 610 along the second surface 30*b* by a first length L that is less than or equal to half of the length of the memory cell-occupied space.

The flash memory device formed by the above steps in the embodiment includes a memory cell structure stacked in a vertical direction, wherein the electron capture layer structure for storing electrons in each memory cell structure is positioned near the channel structures, so that after a period of programming operation, the problem of charge diffusion in the electron capture layer is avoided, thereby avoiding a decrease in the threshold voltage for the memory cell and facilitating the data retention capability.

The foregoing detailed embodiments are merely examples for the sake of clarity and no unnecessary limitations should be understood therefrom, as variations or modifications will be obvious to those skilled in the art on the basis of the above description. It is not necessary or possible to exhaust all embodiments herein and the obvious changes or modifications derived therefrom remain within the scope of protection of the present disclosure.

What is claimed is:

1. A method for fabricating a 3D NAND flash memory device, wherein the method for fabricating the 3D NAND flash memory device comprises:

providing a semiconductor substrate layer, forming cell isolation structures spaced apart in a horizontal direction and channel structures penetrating the cell isolation structures in a vertical direction on the semiconductor substrate layer, wherein interval spaces on both sides of the cell isolation structures are source lead-out spaces; each of the cell isolation structures comprises a plurality of cell isolation layers spaced apart in a vertical direction, interval spaces inside the cell isolation structure are memory cell-occupied spaces, and a sidewall of each of the channel structures is exposed at a position of the memory cell-occupied spaces;

depositing first dielectric layers and second dielectric layers in sequence, wherein the second dielectric layers cover the first dielectric layers, and the first dielectric layers at least cover exposed surfaces of the cell isolation structures; the exposed surfaces of cell isolation structures comprises: a surface of each of the memory cell-occupied spaces and a side of each layer of the plurality of cell isolation layers closer to the a source lead-out space of the source lead-out spaces than other sides of said each layer; the surface of the memory cell-occupied spaces comprises: at least one first surface of the channel structures exposed from the memory cell-occupied spaces, and at least one second surface of the cell isolation layers positioned in the memory cell-occupied spaces;

etching the second dielectric layers to remove all of the second dielectric layers on a side surface and at least part of the second dielectric layers on the at least one second surface, and retaining all of the second dielectric layers on at least one first surface, with the remaining second dielectric layer forming at least one electron capture layer for memory cell structures; and fabricating the memory cell structures and electrode structures for the 3D NAND flash memory device;

wherein the step of etching the second dielectric layer, removing all of the second dielectric layer on the side, removing at least part of the second dielectric layer on the second surface, and retaining all of the second dielectric layer on the first surface comprises:

coating photosensitive layers, wherein the photosensitive layers fill the memory cell-occupied spaces and the source lead-out spaces;

removing the photosensitive layers positioned in the source lead-out spaces, and retaining the photosensitive layers positioned in the memory cell-occupied spaces;

etching the second dielectric layers using an etching solution with the remaining photosensitive layers as etching masks to remove all of the second dielectric layers on the side surface and to remove at least a portion of the second dielectric layers on the second surface, and retaining all of the second dielectric layers on the first surface;

removing the remaining photosensitive layers.

2. The method for fabricating a 3D NAND flash memory device according to claim 1, wherein the step of etching the second dielectric layers using an etching solution with the remaining photosensitive layer as an etching mask, and retaining the second dielectric layers positioned on the at least one first surface of the channel structures exposed from the memory cell-occupied spaces to form at least one electron capture layer structure comprises:

etching the second dielectric layers using an etching solution with the remaining photosensitive layers as etching masks to remove all of the second dielectric layers on the side surface and to remove all of the second dielectric layers on the at least one second surface, and retaining all of the second dielectric layers on the at least one first surface;

forming the at least one electron capture layer for the memory cell structure from the remaining second dielectric layers.

3. The method for fabricating a 3D NAND flash memory device according to claim 1, wherein the step of etching the second dielectric layers using an etching solution with the remaining photosensitive layer as an etching mask, and retaining the second dielectric layers positioned on a surface of the channel structure exposed from the memory cell-occupied spaces to form at least one electron capture layer structure comprises:

etching the second dielectric layers using an etching solution with the remaining photosensitive layers as etching masks to remove all of the second dielectric layers on the side surface and to remove at least a portion of the second dielectric layers on the at least one second surface, and retaining all of the second dielectric layers on the at least one first surface;

forming the electron capture layer for the memory cell structure from the remaining second dielectric layers, forming an extension portion of the electron capture layer from the remaining second dielectric layers on the at least one second surface, and forming a main body of the electron capture layer from the remaining second dielectric layers on the at least one first surface.

4. The method for fabricating a 3D NAND flash memory device according to claim 3, wherein the channel structures comprises channel holes, and channel polysilicon layers and channel dielectric layers that fill the channel holes;

the channel holes extend into the semiconductor substrate layer, with the channel polysilicon layers covering the inner wall of the channel holes and surrounding the outer periphery of the channel dielectric layers;

the extension portion extends from both ends of a main body along the at least one second surface by a first length.

5. The method for fabricating a 3D NAND flash memory device according to claim 1, wherein the step of removing the photosensitive layers positioned in the source lead-out spaces, and retaining the photosensitive layers positioned in the memory cell-occupied spaces comprises:

irradiating the photosensitive layers filled in the source lead-out spaces through a mask by utilizing ultraviolet rays;

removing the photosensitive layers filled in the source lead-out spaces by means of a developing solution, and retaining the photosensitive layers positioned in the memory cell-occupied spaces.

6. The method for fabricating a 3D NAND flash memory device according to claim 1, wherein in the step of fabricating the memory cell structure and the electrode structure for the flash memory device, the step of fabricating the memory cell structure for the 3D NAND flash memory device comprises:

etching the first dielectric layers to remove the first dielectric layers covering the side surface, retaining the first dielectric layers covering the at least one first surface of the memory cell-occupied spaces, with the remaining first dielectric layers forming at least one electron tunneling layer for the memory cell structure;

fabricating at least one oxide isolation layer and at least one high dielectric film layer for the memory cell structure;

the at least one oxidation isolation layer is positioned in the memory cell-occupied spaces, covering an exposed surface of the electron tunneling layer and an exposed surface of the electron capture layer;

the high dielectric film layer is positioned in the memory cell-occupied spaces, covering an exposed surface of the at least one oxide isolation layer;

the at least one high dielectric thin film layer surrounds and forms at least one gate-occupied space which is used to form at least one gate electrode.

7. The method for fabricating a 3D NAND flash memory device according to claim 1, wherein, in the step of providing a semiconductor substrate layer, forming a plurality of cell isolation structures spaced apart in a horizontal direction and channel structures penetrating the cell isolation structures in a vertical direction on the semiconductor substrate layer, wherein the interval spaces on both sides of the cell isolation structures are source lead-out spaces, a bottom layer of each of the cell isolation structures is the memory cell-occupied space, and a top layer of each of the cell isolation structures is the cell isolation structure.

8. The method for fabricating a 3D NAND flash memory device according to claim 1, wherein the step of providing a semiconductor substrate layer, forming a plurality of cell isolation structures spaced apart in a horizontal direction and channel structures penetrating the cell isolation structures in a vertical direction on the semiconductor substrate layer, wherein the interval spaces on both sides of the cell isolation structures are source lead-out spaces comprises:

providing a semiconductor substrate layer, forming a composite layer structure on the semiconductor substrate layer, wherein the composite layer structure comprises multiple sacrificial dielectric layers and multiple cell isolation dielectric layers alternately stacked in sequence;

forming channel structures in the composite layer structure, wherein the channel structures penetrate the composite layer structure in a vertical direction and extend into the semiconductor substrate layer;

source lead-out spaces are formed in the composite layer structure, wherein ends of the sacrificial dielectric layers and an upper surface of the semiconductor substrate layer are exposed in the source lead-out spaces;

removing the sacrificial dielectric layers by etching to form the memory cell-occupied space, and forming cell isolation layers from the remaining multiple cell isolation dielectric layers.

* * * * *